Oct. 17, 1967 G. L. MILLER 3,348,068

THRESHOLD DISCRIMINATOR AND ZERO-CROSSING DETECTOR

Filed April 29, 1965

INVENTOR
G. L. MILLER
BY R. O. Nimtz
ATTORNEY 3,348,068
Patented Oct. 17, 1967

3,348,068

THRESHOLD DISCRIMINATOR AND ZERO-CROSSING DETECTOR

Gabriel L. Miller, Westfield, N.J., assignor to Bell Telephone Laboratories, Incorporated, New York, N.Y., a corporation of New York Filed Apr. 29, 1965, Ser. No. 451,731
9 Claims. (Cl. 307—88.5)

ABSTRACT OF THE DISCLOSURE

The instant during which an input pulse passes through its zero crossing point is detected for all pulses which exceed a predetermined threshold level by a circuit wherein the input pulse is applied to the base of a first transistor of a pair of emitter coupled transistors, the second transistor of which has a tunnel diode circuit in its collector path. The threshold level is set by a voltage coupled to the base of the second transistor, which voltage is derived from the arm of a potentiometer connected across a potential source by a third switching transistor whose base-emitter junction is connected across the tunnel diode circuit. When the input pulse exceeds the threshold level, conduction is transferred from the second and third transistors to the first transistor. Consequently, the voltage coupled to the base of the second transistor is reduced to zero in preparation for the instant of zero crossing. At zero crossing, the tunnel diode snaps the third transistor back into conduction.

Figure 1:
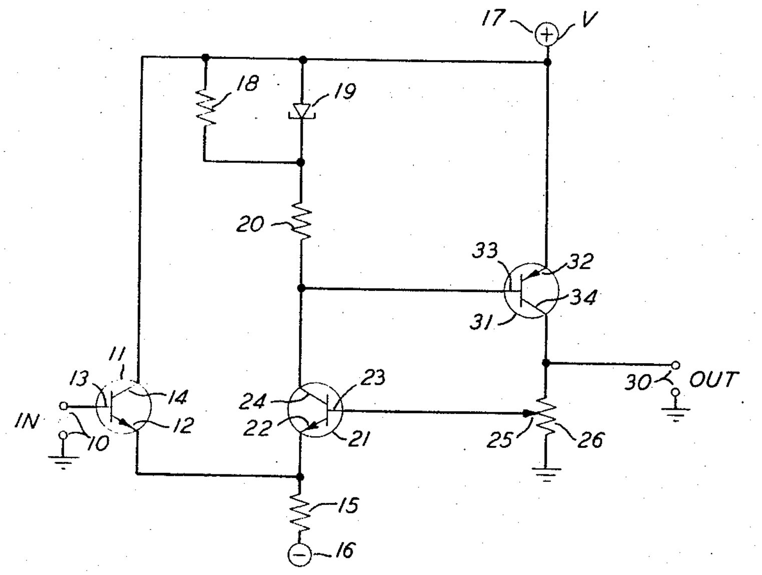

This invention relates to a threshold discriminator circuit with zero-crossing detection and, more particularly, to a modified Schmitt trigger circuit wherein the threshold sensitivity of the circuit can be changed without effecting a change in the recovery threshold of zero potential.

In various applications relating to pulse timing, it is desired to compare the coincidence of two voltage pulses providing they exceed a predetermined minimum amplitude. Unfortunately, the time at which the leading edge of a pulse reaches a predetermined amplitude is generally dependent on the amplitude of the pulse, and therefore the use of simple amplitude discriminator circuits at the input of a coincidence detector will result in an error which is a function of the input pulse amplitude.

To correct this particular timing error, a Schmitt trigger circuit has been used in the prior art. This circuit is essentially a bistable circuit in which the initial triggering threshold level on the rising edge of the input pulse occurs at a greater value of the pulse amplitude than the level of the recovery triggering threshold on the falling edge of the input pulse. For any particular initial triggering threshold, a Schmitt trigger circuit can be designed so that the recovery triggering threshold is equal to zero potential and thereby indicates zero-crossing.

One difficulty with prior art Schmitt trigger circuits, however, is that the initial triggering sensitivity of the circuit cannot be changed without effecting a change in the recovery threshold. To overcome this particular deficiency, the circuit shown in Patent 3,018,386 of Jan. 23, 1962, to R. L. Chase was designed. In addition to being complicated with many components and therefore expensive and space consuming, the circuit by Chase also suffers in being rather sluggish in indicating the recovery threshold due to its time dependence on the charge storage characteristics of an ordinary diode. The circuit by Chase is therefore not well suited to situations which require compact equipment, for example in satellites, and a precise indication of the zero-crossing point with an accuracy of much better than a microsecond.

It is therefore one object of the present invention to provide a simple threshold discriminating circuit with zero-crossing detection wherein the threshold sensitivity can be changed.

Another object of the present invention is to provide a simple threshold discriminating circuit with zero-crossing detection wherein the output indication of zero-crossing is much more rapid than in prior art circuits.

These and other objects are obtained in accordance with the present invention wherein an emitter-coupled pair of transistors have a tunnel diode in the second transistor collector circuit, the input pulse being applied to the base of the first transistor. The threshold level is set by a variable voltage on the base of the second transistor, which voltage is derived from a constant potential source by a potentiometer connected in series with a third switching transistor whose base-emitter junction is connected across said tunnel diode means. When the input pulse reaches the threshold level potential, the first transistor is turned ON and the second and third transistors are turned OFF, thereby causing the potential on the base of the second transistor to rapidly decay to zero in preparation for the zero potential at zero-crossing. At zero-crossing, transfer of conduction from the first transistor to the second transistor causes the tunnel diode to snap the third transistor ON. The accompanying rapid rise in potential across the potentiometer indicates the instant of zero-crossing.

Figure 2:
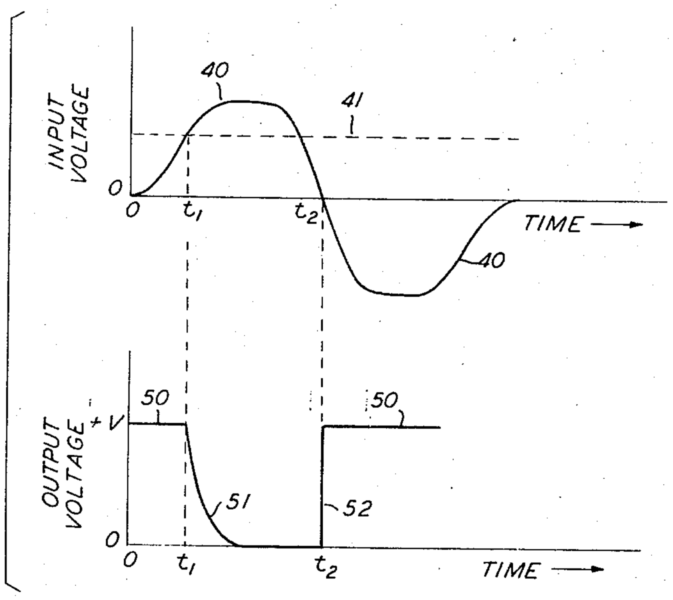

The invention will be better understood from the following description, taken in connection with the accompanying drawing, in which:

FIG. 1 is a schematic circuit diagram of one embodiment of the present invention; and FIG. 2 is a pair of voltage waveforms useful in explaining the operation of the circuit of FIG. 1.

Referring first to the circuit of FIG. 1, input terminals 10 couple an input pulse between reference potential and base 13 of transistor 11. Collector 14 is connected to positive potential source 17, and emitter 12 is connected through resistor 15 to minus potential source 16. Emitter 12 is also connected to emitter 22 of transistor 21 forming the characteristic coupling of a Schmitt trigger circuit.

Collector 24 of transistor 21 is connected through resistor 20 in series with the parallel combination of resistor 18 and tunnel diode 19, the effect of which is to be described hereinbelow. Base 23 is connected to movable arm 25 of potentiometer 26, one end of which is connected to reference potential and the other end of which is connected to collector 34 of transistor 31. Base 33 of transistor 31 is connected to collector 24, and emitter 32 is connected to positive potential source 17.

With zero voltage present at input 10, transistor 11 is held OFF, i.e., out of conduction, by the positive potential on emitter 12 established by the current flow from positive potential source 17 through normally ON transistor 21 and resistor 15 to minus potential source 16. Transistor 21 is held ON, i.e., in conduction, by virtue of the positive potential on base 23 which is established by the current flow from source 17 through normally ON transistor 31 and potentiometer 26 to reference potential. The value of potential on base 23, hereinafter designated as the threshold potential, is determined by the position of arm 25.

With transistor 31 in conduction, most of the current through transistor 21 will flow through the base-emitter junction of transistor 31 and tunnel diode 19 will be in its high voltage state, i.e., at a voltage in excess of the voltage at the valley in the well-known current versus voltage characteristic of a tunnel diode. The relationship of currents through a tunnel diode in parallel with the base-emitter junction of a transistor is described in Patent 3,153,151 of Oct. 13, 1964, to R. P. Farnsworth. In the instant circuit, tunnel diode 19 is advantageously not placed directly in parallel with base-emitter junction 33–32 but is series connected through resistor 20 having a low value in the order of the impedance of the tunnel diode in its high voltage state. Resistor 20 reduces the voltage drop across tunnel diode 19, thereby improving the life of the diode.

Referring now to FIG. 2, curve 40 is plot of input voltage versus time for a typical input pulse which is applied to input terminals 10. The threshold level of the input voltage which must be reached before transistor 11 will conduct is indicated by dotted line 41 in FIG. 2. As indicated hereinabove, the particular voltage value at threshold level 41 is determined by the position of arm 25. When the input voltage reaches level 41, as shown at time $t_1$, transistor 11 turns ON causing transistor 21 to turn OFF in the usual Schmitt trigger action. Since base 33 is then no longer connected through to source 16, transistor 31 also turns OFF, causing the output voltage at terminals 30 to decrease as shown in curve 50 at time $t_1$ in FIG. 2. The decrease in current through tunnel diode 19 causes the diode to snap to its low voltage state, i.e., to a value lower than the voltage at the current peak in the well-known current versus voltage characteristic of a tunnel diode.

For reasons which will be obvious in the discussion which follows, it is advantageous to have the decay of the output voltage from its normally high positive potential to zero potential occur as rapidly as possible. This decay, designated in curve 50 of FIG. 2 as region 51, should be rapid enough so that base 23 is at zero potential at the time ($t_2$) when the input voltage zero-crossing occurs.

The rapidity with which transistor 31 is turned OFF is materially improved by the presence of resistor 18 which causes tunnel diode 19 to snap to its low voltage state while a significant amount of current is still flowing in transistor 21. This result occurs since the effect of adding resistor 18 in parallel with diode 19 is to provide a by-pass for some of the current which would otherwise have to flow through diode 19, thereby permitting the current in diode 19 to reach the valley in its current versus voltage characteristic while a significant amount of current is still flowing through the parallel combination. The effect on the current versus voltage plots of a resistor in parallel with a tunnel diode and base-emitter junction is adequately set forth in FIG. 5 of the above-identified patent to Farnsworth.

For the values of capacitance and resistance involved in the circuit which was constructed, substantially all of decay 51 was made to occur in approximately 0.1 μsecond, which is adequate for input pulses having periods as short as one μsecond.

When the input voltage pulse again reaches zero at time $t_2$, transistor 11 can no longer hold transistor 21 out of conduction since base 23 is at zero potential, and the latter transistor begins to turn ON. The attendant increase in current through tunnel diode 19 causes it to snap to its high voltage state, thereby causing transistor 31 to rapidly turn ON and raise the potential at output terminals 30 to a value substantially equal to positive potentail source 17. The resulting step-like rise in output voltage which occurs at zero-crossing is shown in curve 50 of FIG. 2 as step 52. For the circuit which was constructed in accordance with the present invention, step 52 was observed to occur in approximately 20 and 30 nanoseconds.

Although the invention has been described and illustrated in connection with one embodiment thereof to explain its principles and operation, other embodiments and modifications within the spirit and scope of the invention will be readily apparent to those skilled in the art.

What is claimed is:

1. An amplitude discriminator and zero-crossing detector comprising, in combination, a first and second transistor connected in a bistable circuit wherein the first transistor is normally out of conduction and the second transistor is normally in conduction, means for coupling an input pulse to the base of said first transistor, and means connected to the base of said second transistor for normally biasing the base-emitter junction of said second transistor in forward biased direction, said latter means comprising a source of potential, a third transistor having its emitter connected to said potential source, tunnel diode means connected in parallel with the base-emitter junction of said third transistor, means connecting the base of said third transistor to said bistable circuit for turning OFF said third transistor when said second transistor is out of conduction, a potentiometer having two ends and an arm, means connecting one of said two ends to the collector of said third transistor, means connecting the other of said two ends to a reference potential, and means connecting said arm to the base of said second transistor the value of potential applied from said arm to the base of said second transistor being equal to a predetermined threshold level when said third transistor is in conduction and equal to zero when said third transistor is OFF.

2. An amplitude discriminator and zero-crossing detector as defined in claim 1 wherein said tunnel diode means includes a first resistor in series with a parallel combination of a tunnel diode and a second resistor.

3. An amplitude discriminator and zero-crossing detector as defined in claim 2 wherein said means for turning OFF said third transistor is a direct connection between the base of said third transistor and the collector of said second transistor.

4. In a bistable multivibrator having a first and second transistor wherein the potential of an input pulse applied to the base of said first transistor must exceed a predetermined value in order to transfer conduction from said second transistor to said, first transistor, tunnel diode means connected as the collector impedance of said second transistor to a source of potential, a third transistor having its base-emitter junction connected in parallel with said tunnel diode means, a potentiometer having its ends connected between the collector of said third transistor and a reference potential, and means connecting the movable arm of the potentiometer to the base of said second transistor.

5. A bistable multivibrator as defined in claim 4 wherein said tunnel diode means includes a resistor in parallel with a tunnel diode, the combination thereof in series with a resistor having a value in the order of the impedance value of said tunnel diode in its high voltage state.

6. An amplitude threshold discriminator and zero-crossing detector comprising, in combination, a first, second and third transistor each having an emitter, base, and collector electrodes, means for coupling input A.C. pulses between the base of said first transistor and reference potential, means connecting the collector of said first transistor to a potential source of one polarity, resistance means having one end connected to the emitter of said first and second transistors and the other end connected to a potential source of opposite polarity, means connecting the collector of said second transistor to the base of said third transistor for turning OFF said third transistor when said second transistor is out of conduction, means connecting the emitter of said third transistor to said source of one potential, tunnel diode means in parallel with the base-emitter junction of said third transistor, and a potentiometer having one end connected to the collector of said third transistor, the other end connected to reference potential, and its arm connected to the base of said second transistor, the setting of the arm of said potentiometer being determinative of the threshold voltage which must be exceeded by said input pulse in order to take said second transistor out of conduction.

7. An amplitude threshold discriminator and zero-crossing detector as defined in claim 6 wherein said tunnel diode means includes a resistor in parallel with a tunel diode, both in series with a resistor having a value of the order of the impedance of said tunnel diode in its high voltage state.

8. In an amplitude discriminator and zero-crossing detector wherein an active bistable device having a control electrode is provided with a threshold voltage with respect to ground potential until said active device is changed from its normal stage after which change the control electrode is provided with said ground potential, means for providing said threshold voltage and indicating the return of said active device to its normal state comprising a source of potential, a transistor having its emitter electrode connected to said source of potential, means connecting the base of said transistor to said active device for forward biasing the base-emitter junction of said transistor when said active device is in its normal state, tunnel diode means connected in parallel with the base-emitter junction of said transistor for snapping said transistor into conduction, and potentiometer means having two ends and an arm with one end connected to the collector of said transistor, the other end connected to said ground potential, and its arm connected to said control electrode.

9. An amplitude discriminator and zero-crossing detector as defined in claim 8 wherein said tunnel diode means includes a tunnel diode in parallel with a first resistor both in series with a second resistor having a value in the order of said tunnel diode impedance.

References Cited

UNITED STATES PATENTS

| | | | |
|---|---|---|---|
| 3,137,826 | 6/1964 | Boudrias | 330—300 |
| 3,201,703 | 8/1965 | Becker | 315—150 |
| 3,215,854 | 11/1965 | Mayhew | 307—88.5 |
| 3,215,948 | 11/1965 | Dalton | 307—88.5 |

OTHER REFERENCES

I.B.M. Technical Disclosure Bulletin, Myers, Jr., vol. 5, No. 1, page 84, June 1962.

ARTHUR GAUSS, *Primary Examiner.*

B. P. DAVIS, *Assistant Examiner.*